United States Patent
Chiang

(10) Patent No.: US 11,854,619 B2
(45) Date of Patent: Dec. 26, 2023

(54) MEMORY DEVICE WITH CONTENT ADDRESSABLE MEMORY UNITS

(71) Applicant: Taiwan Semiconductor Manufacturing Company, Ltd., Hsinchu (TW)

(72) Inventor: Katherine H. Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/579,165

(22) Filed: Jan. 19, 2022

(65) Prior Publication Data

US 2023/0230637 A1    Jul. 20, 2023

(51) Int. Cl.
*G11C 15/04* (2006.01)
*G11C 11/22* (2006.01)

(52) U.S. Cl.
CPC .......... *G11C 15/04* (2013.01); *G11C 11/2257* (2013.01); *G11C 11/2273* (2013.01); *G11C 11/2275* (2013.01)

(58) Field of Classification Search
CPC .. G11C 15/04; G11C 11/2257; G11C 11/2273
See application file for complete search history.

(56) References Cited

U.S. PATENT DOCUMENTS

| | | | |
|---|---|---|---|
| 2019/0325963 A1* | 10/2019 | Noack | G11C 15/046 |
| 2020/0006383 A1* | 1/2020 | Petti | H10B 51/30 |
| 2021/0142837 A1* | 5/2021 | Yu | G11C 15/04 |
| 2021/0280250 A1 | 9/2021 | Advani et al. | |
| 2022/0351776 A1* | 11/2022 | Nam | G11C 11/223 |

* cited by examiner

*Primary Examiner* — Han Yang
(74) *Attorney, Agent, or Firm* — Eschweiler & Potashnik, LLC

(57) ABSTRACT

In some embodiments, the present disclosure relates to a memory device, including a plurality of content addressable memory (CAM) units arranged in rows and columns and configured to store a plurality of data states, respectively. A CAM unit of the plurality of CAM units includes a first ferroelectric memory element, a plurality of word lines extending along the rows and configured to provide a search query to the plurality of CAM units for bitwise comparison between the search query and the data states of the plurality of CAM units, and a plurality of match lines extending along the columns and configured to output a plurality of match signals, respectively from respective columns of CAM units. A match signal of a column is asserted when the data states of the respective CAM units of the column match corresponding bits of the search query.

20 Claims, 6 Drawing Sheets

MEMORY DEVICE WITH CONTENT ADDRESSABLE MEMORY UNITS

BACKGROUND

Many modern electronic devices contain electronic memory configured to store data. As technology advances at a rapid pace, engineers work to make memory devices smaller, yet more complex to improve and develop electronic devices that are more efficient, more reliable, and have more capabilities. Individual memory cells may be vertically stacked in three-dimensional (3D) memory, allowing for more a greater bit density, and thus more efficient electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
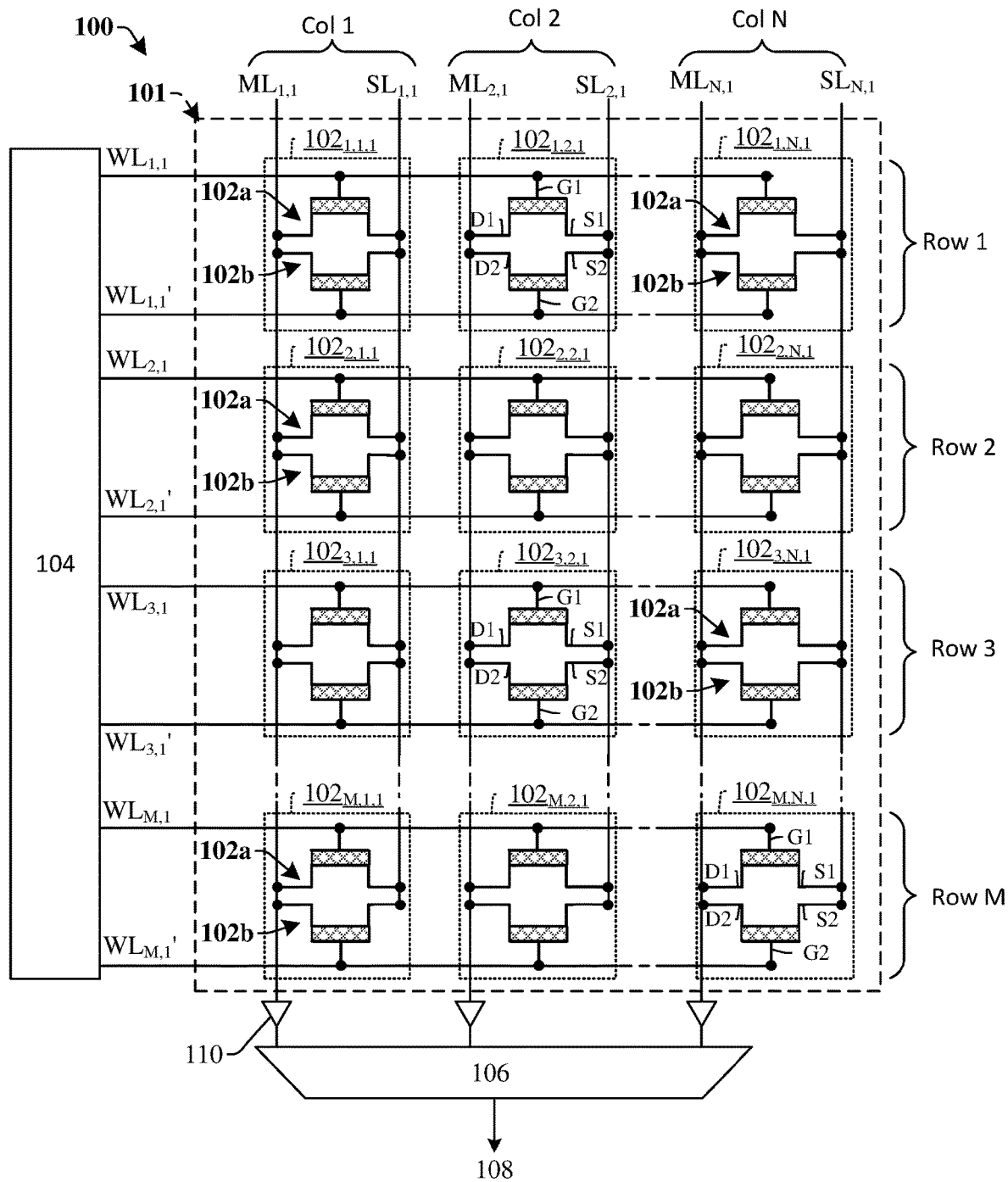
FIG. 1 illustrates a circuit diagram of some embodiments of a memory device comprising ferroelectric memory elements.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Content addressable memory (CAM) devices are used to compare input search data against an array of stored data. A CAM device includes an array of CAM units, wherein the CAM units of the array are arranged in rows and columns. In some previous approaches, each individual CAM unit of the array may comprise a static random-access memory (SRAM) cell with approximately six transistors for storing data. Each individual CAM unit further comprises a comparator, which includes at least two additional transistors, that allows for a comparison between a data state of the SRAM cell and input search data. However, because each CAM unit comprises at least eight transistors, the CAM device as a whole has a large footprint and/or is expensive in terms of power consumption and cost per bit. This prevents such CAM arrays from being widely used beyond niche and special-purpose systems.

In view of the above, the present disclosure relates to improved CAM devices. Respective CAM units of the CAM device each have no more than two ferroelectric transistors for storing data. In some contexts, these ferroelectric transistors may be referred to as ferroelectric memory elements. Hence, because each CAM unit includes no more than two ferroelectric transistors, the disclosed memory devices have a smaller footprint and/or are less expensive in terms of power consumption and cost per bit in comparison to previous CAM units that each included eight transistors. Further, since the ferroelectric transistors are non-volatile, the memory device can be used for a wider range of applications in which power is not constantly provided.

FIG. 1 illustrates a circuit diagram of some embodiments of a memory device 100 comprising an array 101 of content addressable memory (CAM) units 102. The CAM units of the array 101 are arranged in a plurality of M rows (words) and a plurality of N columns (bits). Though FIG. 1 shows only rows and columns in the plane of the page, it will be appreciated in some other embodiments that multiple pages of rows and columns can be included to give rise to a three-dimensional array. As such, each CAM unit is labeled in FIG. 1 as $102_{row, column, page}$, where the page is 1 in FIG. 1's example and M and N can be any integer value, and typically M and N are different, though in principle, N and M could alternatively be equal to one another.

As illustrated, each CAM unit 102 includes a pair of ferroelectric memory elements (e.g., first ferroelectric memory element 102a and second ferroelectric memory element 102b), which cooperatively store a data state for that respective CAM unit 102. Each first ferroelectric memory element 102a includes a first gate terminal (G1), a first source terminal (S1), and a first drain terminal (D1); and each second ferroelectric memory element 102b includes a second gate terminal (G2), a second source terminal (S2), and a second drain terminal (D2); which are operably coupled as illustrated. For ease of viewing, only a few of the first ferroelectric memory elements, second ferroelectric memory elements, gate terminals, source terminals, and drain terminals have been labeled in FIG. 1.

Pairs of word lines (WLs) extend along the respective rows and are coupled to gates of ferroelectric memory elements of the respective rows. The pairs of word lines are labeled $WL_{row, page}$. For example, a first word line $WL_{1,1}$ is coupled to the first ferroelectric memory elements 102a for each CAM unit in Row 1, and a second word line $WL_{1,1}'$ is coupled to the second ferroelectric memory elements 102b for each CAM unit in Row 1. Match lines (ML) extend along the respective columns and are coupled to drain terminals of the ferroelectric memory elements of the respective columns; and source lines (SL) extend along the respective columns and are coupled to source terminals of the ferroelectric memory elements of the respective columns. The match lines and source lines are labeled $ML_{row,page}$ and $SL_{row,page}$. For instance, first match line $M_{1,1}$ is coupled to drain terminals of each first ferroelectric memory element 102a and each second ferroelectric memory element 102b along Column 1; and first source line $SL_{1,1}$ is coupled to the source terminal of each first ferroelectric memory element 102a and each second ferroelectric memory element 102b along Column 1. A word line driver 104 provides voltage biases to the word lines during read and write operations, and a source line driver and match line driver (not shown) correspondingly provide voltage biases to the source lines and match lines during read operations and/or write operations. The match lines are also coupled to a decoder 106. In some embodiments, a buffer 110, such as an inverter, is disposed on respective match lines between the decoder 106 and the CAM units 102 of the array. The buffer 110 buffers the signal on the match line to the input of the decoder 106.

Since the data state for a given CAM unit 102 is based on threshold voltages of the first and second ferroelectric memory elements 102a, 102b, the data state for a given CAM unit 102 is programmed by setting the threshold voltages of the first and second ferroelectric memory elements 102a, 102b of the CAM unit according to a pre-established convention. For example, a "0" data state for a given CAM unit can correspond to the first ferroelectric memory element 102a of the CAM unit having a high threshold voltage and the second ferroelectric memory element 102b of the CAM unit having a low voltage threshold; while a "1" data state for the CAM unit can "flip" these threshold voltages (e.g., a "1" data state correspond to the first ferroelectric memory element 102a having the low threshold voltage, and the second ferroelectric memory element 102b having the high threshold voltage). By programming the CAM units according to such a convention, predetermined search results can be written into the array 101 such that each CAM unit 102 stores a separate data bit (data state). As an example, Column 1 can be programmed store a first predetermined search result of "000 . . . 0" (e.g., each first ferroelectric memory element 102a of Column 1 has a high voltage threshold, while each second ferroelectric memory element 102b of Column 1 has a low voltage threshold), Column 2 can store a second predetermined search result of "111 . . . 1" (e.g., each first ferroelectric memory element 102a of Column 2 have a low voltage threshold, while each second ferroelectric memory element 102b of the Column 2 have a high voltage threshold), while Column N can store a third predetermined search result of "010 . . . 1". These predetermined search results are superimposed onto FIG. 1 for clarity, but it will be appreciated that any other predetermined search results could also be written to the array 101, and this writing can occur prior to search queries being provided and/or can be updated during or after search queries are provided.

After these predetermined search results have been written to the array 101, a search query can be provided to the array 101 by appropriately biasing the match lines, word lines and/or source lines. When the search query matches the predetermined search result of a given column, the match line of the corresponding column is asserted to indicate a match has occurred for the data of that column while other match lines whose data does not match the search query are de-asserted. In response to a match line of a given column being asserted, the decoder 106 can output an address which corresponds to the column. So furthering the example above, consider a case where, prior to initiation of a search, the match lines are each pre-charged to a first voltage and the source lines are each grounded. If a search query of "000 . . . 0" is then provided via the word lines, this search query matches the predetermined search result (e.g., "000 . . . 0") stored in the CAM units of the first column. Accordingly, each ferroelectric memory element for each CAM unit of the first column remains deactivated and the first match line $ML_{1-1}$ remains at the pre-charged, first voltage. For each other column, there is at least one search query bit that does not match the corresponding predetermined search result bit provided on the word lines, and this mismatch thereby enables the ferroelectric memory unit of the mismatched CAM unit and pulls the corresponding match lines of Column 2-Column N to ground. Thus, in this example, if the search query is "000 . . . 0", $ML_{1,1}$ remains at the first, pre-charged voltage, while $ML_{2,1}$ through $ML_{N,1}$ are pulled to ground; and the decoder 106 returns the address of column 1. Further, if the search query is "111 . . . 1", $ML_{2,1}$ remains at the first, pre-charged voltage, while $ML_{1,1}$ and $ML_{N,1}$ are pulled to ground, and the decoder 106 returns the address of column 2. Further still, if the search query is "101 . . . 0", $ML_{N,1}$ remains at the first, pre-charged voltage, while $ML_{1,1}$ and $ML_{2,1}$ are pulled to ground, and the decoder 106 return the address of column N.

Thus, the memory device 100 allows for a fast bitwise comparison between a large number of predetermined search results and a specific data query, and provides an address at which a match occurs. Notably, because each CAM unit 102 of the memory device 100 includes only a first ferroelectric memory element and a second ferroelectric memory element (e.g., considerably less than eight transistors of other CAM units), this memory device 100 provides for more compact searching than previously available. It will be appreciated that although the example discussed above was couched in terms of binary content addressable memory, the disclosure is also applicable to ternary content addressable memory as well as other types of content addressable memory.

Another example will now be described with reference to FIG. 1. In this example, the data state of each CAM unit is ternary such that each CAM unit can store a first state (e.g., a logical '0'), a second state (e.g., a logical '1'), or a third state (e.g., a logical 'don't care'). In some of such embodiments, when the corresponding first ferroelectric memory element 102a has the first threshold voltage and the corresponding second ferroelectric memory element 102b has the second threshold voltage, the CAM unit is in the first state. Further, when the corresponding first ferroelectric memory element 102a has the second threshold voltage and the corresponding second ferroelectric memory element 102b has the first threshold voltage, the CAM unit is in the second state. Further still, when both the corresponding first ferroelectric memory element 102a and the corresponding second ferroelectric memory element 102b have the second threshold voltage, the CAM unit is in the third state. In alternative embodiments, respective CAM units of the plurality of CAM units may have alternate combinations that correspond to the first state, the second state, and the third state. In further alternative embodiments, the operation of writing data to and searching for data in the plurality of CAM units may be adjusted accordingly.

During operation, predetermined search results are initially written to the CAM units via the plurality of word lines and the plurality of match lines. Programming the predetermined search results is a two-step process. For the first step of the two-step process, the word line driver 104 applies a first voltage to the gates of both the corresponding first ferroelectric memory element 102a and the corresponding second ferroelectric memory element 102b via a corresponding first word line (e.g., $WL_{1,1}$) and a corresponding second word line (e.g., $WL_{1,1}'$) of the plurality of word lines, respectively, and a ground voltage is applied to the drains of both the corresponding first ferroelectric memory element 102a and the corresponding second ferroelectric memory element 102b via a corresponding match line (e.g., $ML_{1,1}$). Hence, setting both the corresponding first ferroelectric memory element 102a and the corresponding second ferroelectric memory element 102b to the first threshold voltage, from where the data state of the CAM unit can be set to the first state, the second state, or the third state by a second step of the two-step process.

As for the second step of the two-step process, to set the data state to the first state, a second voltage having an opposite polarity and approximately half the magnitude of the first voltage is applied to the gate of the second ferroelectric memory element 102b via the second word line, and a third voltage having a same polarity and approximately half the magnitude of the first voltage is applied to the drain of the second ferroelectric memory element 102b via the corresponding match line. Hence, setting the second ferroelectric memory element 102b to the second threshold voltage. To set the data state to the second state, the second voltage is applied to the gate of the first ferroelectric memory element 102a via the first word line, and the third voltage is applied to the drain of the first ferroelectric memory element 102a via the corresponding match line. Hence, setting the first ferroelectric memory element 102a to the second threshold voltage. To set the data state to the third state, the second voltage is applied to the gates of both the first ferroelectric memory element 102a and the second ferroelectric memory element 102b via the first word line and the corresponding second word line, respectively, and the third voltage is applied to the drains of both the first ferroelectric memory element 102a and the second ferroelectric memory element 102b via the corresponding match line. Hence, setting both the first ferroelectric memory element 102a and the second ferroelectric memory element 102b to the second threshold voltage. In embodiments in which no data is to be written to a CAM unit, a voltage of approximately 0V is applied to the corresponding first word line, the corresponding second word line, and the corresponding match line. In alternative embodiments in which the first threshold voltage is greater than the second threshold voltage, the second voltage has a same polarity as the first voltage, and the third voltage has an opposite polarity than the first voltage.

After the predetermined search results are stored, search query data is provided to the word line driver 104. To search for a data state of a CAM unit of the plurality of CAM units 102, the word line driver 104 first applies a pre-charge voltage to the gates of both the corresponding first ferroelectric memory element 102a and the corresponding second ferroelectric memory element 102b via a corresponding first word line (e.g., $WL_{1,1}$) and a corresponding second word line (e.g., $WL_{1,1}'$) of the plurality of word lines, respectively. A supply voltage is applied to the drains of both the corresponding first ferroelectric memory element 102a and the corresponding second ferroelectric memory element 102b via a corresponding match line (e.g., $ML_{1,1}$). A ground voltage is applied to the sources of both the corresponding first ferroelectric memory element 102a and the corresponding second ferroelectric memory element 102b via a corresponding source line (e.g., $SL_{1,1}$). In some embodiments, the pre-charge voltage is less than the first threshold voltage. The word line driver 104 can then search for either the first data state or the second data state by applying a differential signal to the CAM unit via a corresponding pair of the plurality of pairs of word lines.

To search for the first data state in the CAM unit, the word line driver 104 applies a first search voltage less than the pre-charge voltage (e.g., 0V) to the gate of the corresponding first ferroelectric memory element 102a via a corresponding first word line, and a second search voltage that is between the first threshold voltage and the second threshold voltage is applied to the gate of the corresponding second ferroelectric memory element 102b via a corresponding second word line. If the CAM unit is not storing the first data state or the third data state, the search voltage will cause the channel of the corresponding second ferroelectric memory element 102b to conduct, and an output signal will be provided to the corresponding match line by the source of the corresponding second ferroelectric memory element 102b. Alternatively, if the CAM unit is storing the first data state or the third data state, the search voltage will not cause the channel of the corresponding second ferroelectric memory element 102b to conduct, and no output signal will be provided by the source of the corresponding second ferroelectric memory element 102b to the corresponding match line. To search for the second data state in the CAM unit, the word line driver 104 applies the first search voltage to the gate of the corresponding second ferroelectric memory element 102b via the corresponding second word line, and the second search voltage is applied to the gate of the corresponding first ferroelectric memory element 102a via the corresponding first word line. If the CAM unit is not storing the second data state or the third data state, the second search voltage will cause the channel of the corresponding first ferroelectric memory element 102a to conduct, and an output signal will be provided by the source of the corresponding first ferroelectric memory element 102a to the corresponding match line. Alternatively, if the CAM unit is storing the second data state or the third data state, the second search voltage will not cause the channel of the corresponding first ferroelectric memory element 102a to conduct, and no output signal will be provided by the source of the corresponding first ferroelectric memory element 102a to the corresponding match line. In some embodiments, since the ground voltage is applied to the corresponding source line, the output signal is the ground voltage, and hence pulls the corresponding match line to ground.

A match signal of a column is asserted by the match line when the data states of the respective CAM units of the column match corresponding bits of the search query, and hence no output signals are applied to the match line by any CAM units of the column. Similarly, the match signal of the column is de-asserted when the data states of the respective CAM units of the column differ from corresponding bits of the search query, and hence an output signal is applied to the match line by a respective CAM unit of the column. The signals on the match lines are buffered by the buffers 110 and are inputted into the decoder 106. When a match signal of the column is asserted, the decoder 106 outputs an address 108 of the column of CAM units that bitwise match the search query.

In some embodiments, during operation, a parallel search is performed by the word line driver 104 and the plurality of match lines such that the plurality of CAM units 102 are searched simultaneously. In some embodiments, when multiple columns of CAM units bitwise match the search query, the address 108 of only the first column of CAM units to assert a match signal is outputted. In some embodiments, the memory device 100 may further comprise a separate array (not shown) comprising a different plurality of CAM units, a different plurality of word lines, and a different plurality of match lines than the array 101 of FIG. 1. In some embodiments, the memory device 100 may be configured to use the address 108 outputted by the array 101 as a search query for the separate array. In some embodiments, the array 101 of FIG. 1 may be searched simultaneously with the separate array. In further embodiments, the memory device 100 may be configured to search the array 101 and output an address 108 that is subsequently processed by the memory device 100. In even further embodiments, the memory device 100 may be configured to search the array 101 and the separate array simultaneously. In yet even further embodiments, the memory device 100 may be configured to process the addresses output by the array 101 and the separate array simultaneously. In some embodiments, since the ferroelectric memory elements 102a, 102b are non-volatile, the memory device can be used for a wider range of applications in which power is not constantly provided.

Since the plurality of CAM units 102 comprise a ferroelectric memory element 102a, the word line driver 104 is able to both provide input search query to the CAM units 102 via the plurality of word lines, as well as program data states of the CAM units 102 via the plurality of word lines. Similarly, the plurality of match lines are able to receive the output signal from the CAM units 102, assert the match signal, as well as program data states of the CAM units 102. Hence, the plurality of CAM units 102 is capable of performing parallel search over all columns in a single cycle using no more than two transistors. This makes the memory device more dense and less expensive in terms of power consumption and cost per bit in comparison to an array of CAM units having an SRAM cell and a comparator.

Figure 2:
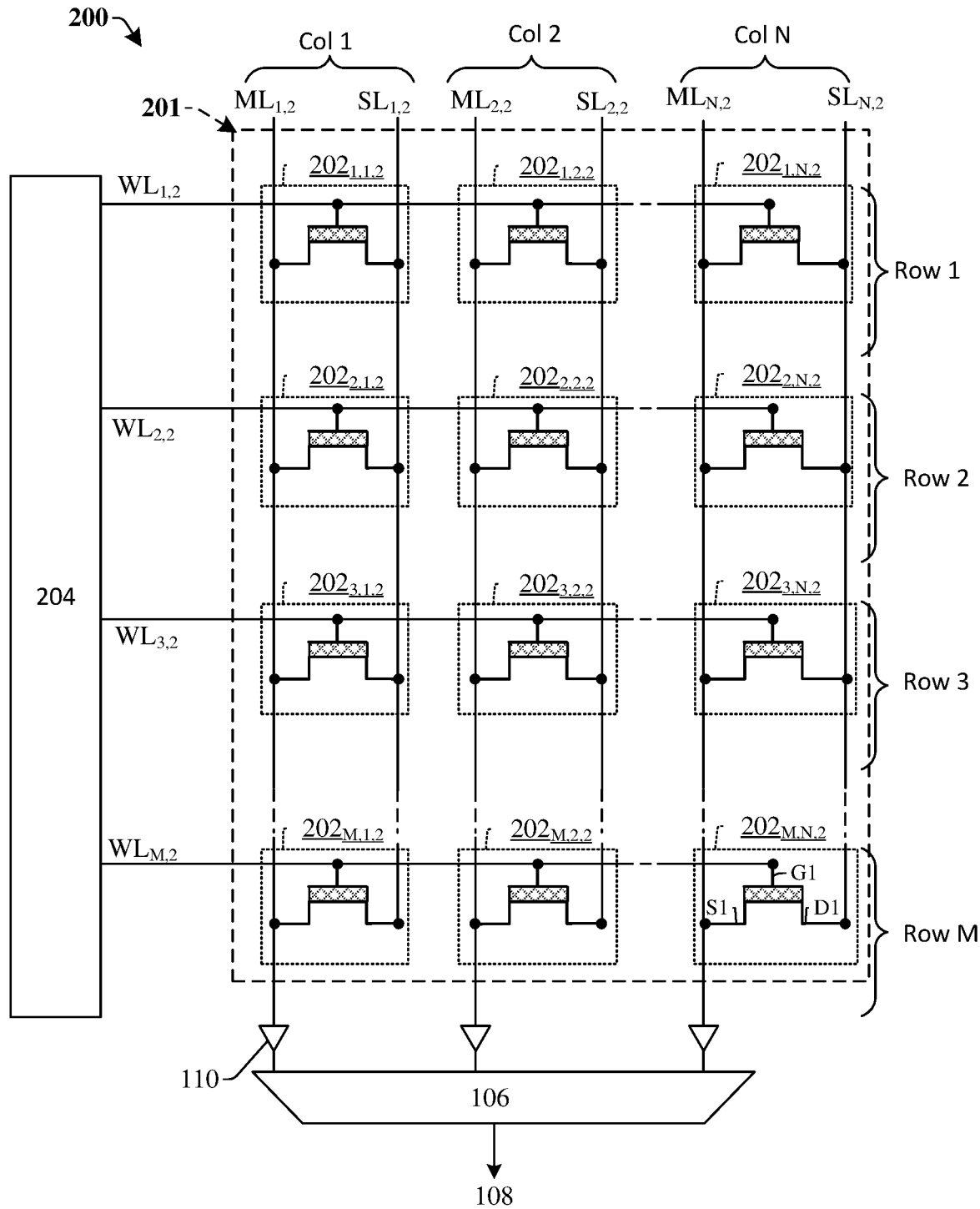
FIG. 2 illustrates a circuit diagram of some alternative embodiments of the memory device of FIG. 1 in which word lines are configured to provide single-ended signals.

FIG. 2 illustrates a circuit diagram of some alternative embodiments of the memory device 100 of FIG. 1 in which word lines of a memory device 200 are configured to provide single-ended signals. An array 201 of CAM units are arranged in a plurality of M rows (words) and a plurality of N columns (bits). As in FIG. 1, only a single page is illustrated in FIG. 2, but it will be appreciated that multiple pages could be included to give rise to a three-dimensional array. Thus, each CAM unit is labeled in FIG. 2 as $202_{row,column,page}$, page where the page is 2 in FIG. 2's example and M and N can be any integer value, and typically M and N are different, though in principle, N and M could alternatively be equal to one another. Respective CAM units of the array 201 comprise a single ferroelectric memory element. Hence, respective CAM units of the array 201 are binary memory cells that can be in a first state (e.g., a logical '0') having a first threshold voltage or a second state (e.g., a logical '1') having a second threshold voltage greater than the first threshold voltage.

During operation, a data state is written to a CAM unit of the array 201 via the plurality of word lines and the plurality of match lines. To program the data state of the CAM unit to the first state, a word line driver 204 first applies a first set voltage to the gate of the CAM unit via a corresponding word line (e.g., $WL_{1,1}$). Hence, setting the ferroelectric memory element to the first threshold voltage. To program the data state to the second state, a second set voltage having an opposite polarity and approximately half the magnitude of the first set voltage is applied to the gate of the CAM unit via the word line, and a third set voltage having a same polarity and approximately half the magnitude of the first set voltage is applied to the drain of the CAM unit via the corresponding match line. Hence, setting the ferroelectric memory element to the second threshold voltage.

In some embodiments consistent with FIG. 2, only the second state is searched, as only a single word line cannot distinguish between multiple states. Hence, where the search query comprises a bit corresponding to the first state, the word line driver 204 does not apply voltage to the gate of the CAM unit via the corresponding word line, and the bit is assumed to match the first data state. Hence, respective columns of the array 201 of CAM units are compared with the search query to ensure that the columns have a number of CAM units storing the second state that is greater than or equal to a number of corresponding bits in the search query that correspond to the second state.

To search a CAM unit for the second state, a ground voltage is applied to a source of the CAM unit via a corresponding source line (e.g., $SL_{1,1}$) and a supply voltage is applied to a drain of the CAM unit via a corresponding match line (e.g., $ML_{1,1}$). Further, a pre-charge voltage less than the first threshold voltage is applied to a gate of the CAM unit via the corresponding word line. A second search voltage between the first threshold voltage and the second threshold voltage is applied to the CAM unit via the corresponding word line. When the CAM unit does not store the second state, the second search voltage will cause a channel of the CAM unit to conduct, and an output signal (e.g., the ground voltage) is applied from the source to the corresponding match line. Alternatively, when the CAM unit does store the second state, the second search voltage will not cause a channel of the CAM unit to conduct, and no output signal is applied from the source to the corresponding match line When a column of CAM units has a number of CAM units storing the second state that is greater than or equal to a number of corresponding bits in the search query that correspond to the second state, and hence no CAM units of the column apply an output signal to the match line corresponding to the column, a match signal is asserted by the match line. When a match signal is asserted, the decoder 106 outputs an address 108 of the column of CAM units. In embodiments in which two or more columns have a number of CAM units storing the second state that is greater than or equal to a number of corresponding bits in the search query that correspond to the second state, the address 108 of the column having the fewest number of CAM units storing the second state of the two or more columns is outputted by the decoder 106. In further embodiments in which two or more columns have the fewest number of CAM units storing the second state, the address 108 of the first column of the two or more columns is outputted.

In some embodiments, a column of CAM units is searched in top to bottom order as illustrated. For example, if the search query comprises four bits corresponding to the second state (e.g., '1111'), the word line driver 204 first applies a search voltage to a first word line $WL_{1,1}$, then to a second word line $WL_{2,1}$, then to a third word line $WL_{3,1}$, then to a fourth word line $WL_{4,1}$. In some embodiments, the word line driver 204 is the word line driver 104 as described in FIG. 1. In alternative embodiments, the memory device 200 may comprise both the array 101 of FIG. 1 and the array 201 of FIG. 2. In further embodiments, the memory device 200 may be configured to perform pipelined operations. For example, the search query used by the word line driver 204 of FIG. 2 may be the address 108 outputted by the decoder 106 of the memory device 100 of FIG. 1. Although the rows are illustrated as extending in a horizontal direction and the columns are illustrated as extending in a vertical direction, it should be appreciated that the rows and columns may alternatively extend in any direction, given that the rows and columns extend in directions orthogonal to one another.

Figure 3:
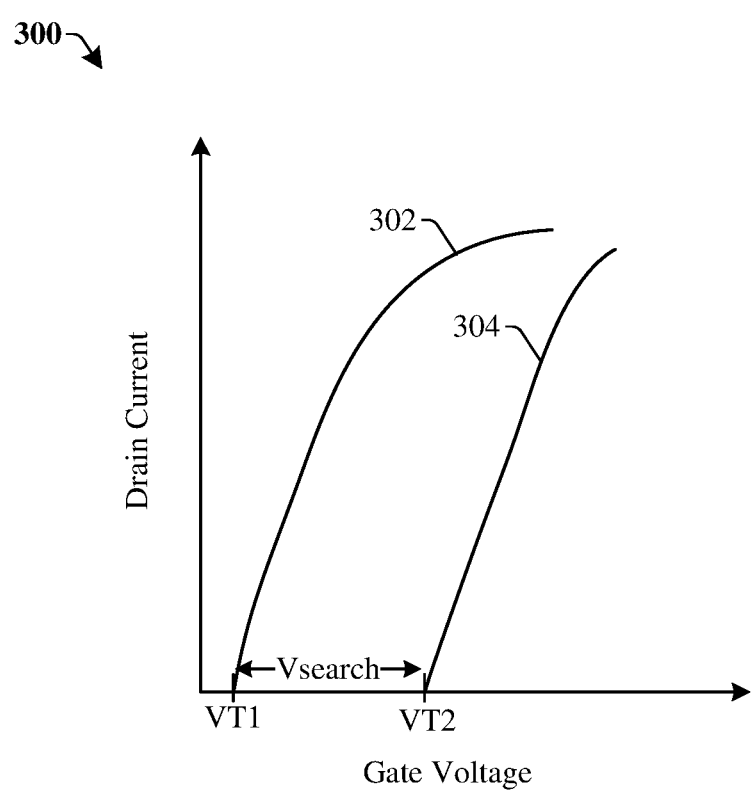
FIG. 3 illustrates a graphical representation of a relationship between drain current and gate voltage for the first and second ferroelectric memory elements of FIG. 1.

FIG. 3 illustrates a graphical representation of a relationship between drain current and gate voltage for the first and second ferroelectric memory elements of FIG. 1. A first curve 302 corresponds to a ferroelectric memory element that turns on at the first threshold voltage VT1, and a second curve 304 corresponds to a ferroelectric memory element that turns on at the second threshold voltage VT2. For the curves 302, 304, as the voltage applied to the gate increases above the first and second threshold voltages, the drain current also increases. To ensure that the first and second ferroelectric memory elements can be properly searched, a search voltage $V_{search}$ (which is applied to the gates of the first and second ferroelectric memory elements) should be between the first threshold voltage and the second threshold voltage. Thus, if a memory element has the first (e.g., low) voltage threshold VT1, when the search voltage is applied to a gate of the memory element, the memory element will conduct current between its source and drain. Conversely, if the memory element has the second (e.g., high) voltage threshold VT2, when the search voltage is applied to the gate of the memory element, the memory element will not conduct current between its source and drain. Thus, the search voltage is selected to differentiate between memory elements having a first voltage threshold or a second voltage threshold. In some embodiments, at the search voltage $V_{search}$, the ratio between the drain current of the first curve 302 and the drain current of the second curve 304 (e.g., ON/OFF current) is greater than $10^8$. In some embodiments, if, at the search voltage $V_{search}$, the ratio between the drain current of the first curve 302 and the drain current of the second curve 304 is too small (e.g., less than $10^8$), the first threshold voltage may not be as easily distinguished from the second threshold voltage, and thus the search process would be slow.

Figure 4:
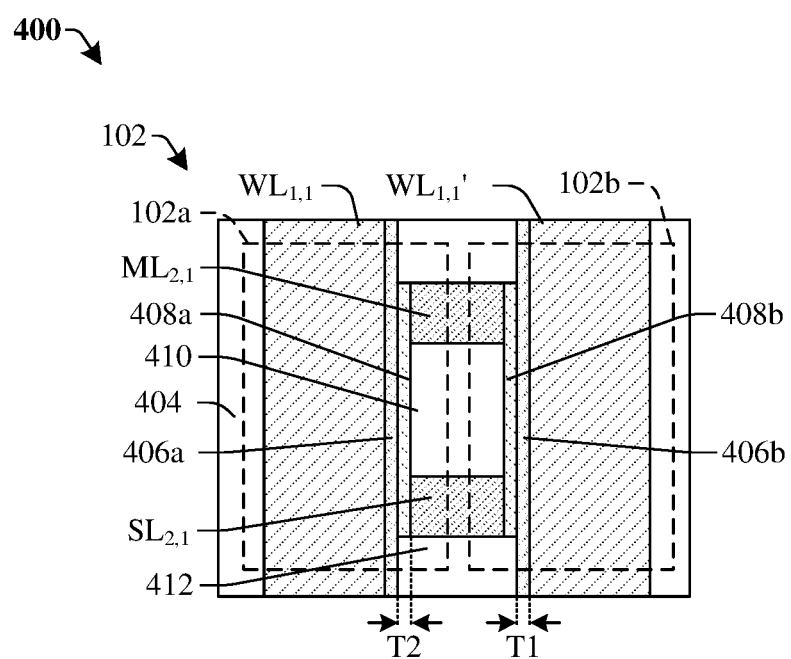
FIG. 4 illustrates a top view of some embodiments of a first ferroelectric memory element and a second ferroelectric memory element.

FIG. 4 illustrates a top view of some embodiments of memory device 400 comprising a first ferroelectric memory element 102a and a second ferroelectric memory element 102b. The first ferroelectric memory element 102a and the second ferroelectric memory element 102b are adjacent to each other in a first direction. The first ferroelectric memory element 102a comprises a gate coupled to a first word line $WL_{1,1}$, a source coupled to a source line $SL_{2,1}$, and a drain coupled to a match line $ML_{2,1}$. The second ferroelectric memory element 102b comprises a gate coupled to a second word line $WL_{1,1}'$, a source coupled to the source line $SL_{2,1}$, and a drain coupled to the match line $ML_{2,1}$.

The first word line $WL_{1,1}$ is disposed along a first sidewall of an outer insulating structure 404. The second word line $WL_{1,1}'$ is disposed along a second sidewall of the outer insulating structure 404. In some embodiments, the first and second word lines $WL_{1,1}$, $WL_{1,1}'$ are coupled to a word line driver (not shown) and are configured to search the first ferroelectric memory element 102a and the second ferroelectric memory element 102b for data states, respectively. The first and second word lines $WL_{1,1}$, $WL_{1,1}'$ are further configured to apply a data signal to program threshold voltages of the first ferroelectric memory element 102a and the second ferroelectric memory element 102b, respectively. In some embodiments, the first ferroelectric memory element 102a and the second ferroelectric memory element 102b define a CAM unit 102. In some of such embodiments, the first and second word lines $WL_{1,1}$, $WL_{1,1}'$ are further configured to provide a differential signal to the CAM unit 102. In further embodiments, the first word line $WL_{1,1}$ and the second word line $WL_{1,1}'$ are configured to apply a data signal to program a data state of the CAM unit 102. In some embodiments, the first and second word lines $WL_{1,1}$, $WL_{1,1}'$ are configured to provide single-ended signals to the first ferroelectric memory element 102a and the second ferroelectric memory element 102b, respectively.

A first ferroelectric layer 406a is disposed along an inner sidewall of the first word line $WL_{1,1}$. A second ferroelectric layer 406b is disposed along an inner sidewall of the second word line $WL_{1,1}'$. In some embodiments, the ferroelectric layers 406a, 406b have a non-volatile remanent polarization that can correspond to a stored data state. In some embodiments, the first ferroelectric layer 406a is configured to store a data state of the first ferroelectric memory element 102a and the second ferroelectric layer 406b is configured to store a data state of the second ferroelectric memory element 102b. In embodiments in which the first ferroelectric memory element 102a and the second ferroelectric memory element 102b define a CAM unit 102, a data state of the CAM unit 102 is dependent on the data state of the first ferroelectric memory element 102a and the data state of the second ferroelectric memory element 102b.

A first channel layer 408a is disposed along an inner sidewall of the first ferroelectric layer 406a. A second channel layer 408b is disposed along an inner sidewall of the second ferroelectric layer 406b. The source line $SL_{2,1}$ is sandwiched between the first channel layer 408a and the second channel layer 408b and is configured to provide an output signal to the match line $ML_{2,1}$ if a search query does not match the data state(s) of the first ferroelectric memory element 102a and/or the second ferroelectric memory element 102b. The match line $ML_{2,1}$ is also sandwiched between the first channel layer 408a and the second channel layer 408b, and is configured to assert the match signals. An inner insulating layer 410 is sandwiched between and provides electrical isolation between the match line $ML_{2,1}$ and the source line $SL_{2,1}$. An isolation structure 412 is disposed along a sidewall of the match line $ML_{2,1}$ and a sidewall of the source line $SL_{2,1}$ that face away from the inner insulating layer 410. The isolation structure 412 provides isolation between ferroelectric memory elements in a second direction perpendicular to the first direction. In some embodiments, the isolation structure 412 contacts opposing surfaces of the first channel layer 408a and opposing surfaces of the second channel layer 408b. In some embodiments, the ferroelectric layers 406a, 406b extend continuously in the second direction.

In some embodiments, the ferroelectric layers 406a, 406b may each have a thickness T1 ranging from approximately 1 nanometer to approximately 20 nanometers, from approximately 1 nanometer to approximately 15 nanometers, from approximately 15 nanometers to approximately 20 nanometers, or some other suitable value. In some embodiments, if the thickness T1 is too small (e.g., less than approximately 1 nanometer), the ferroelectric layers 406a, 406b may have too low of a remanent polarization to effectively store data. In some embodiments, if the thickness T1 is too large (e.g., greater than approximately 20 nanometers), the orthorhombic phase of the ferroelectric layers 406a, 406b may have unstable ferroelectricity, such that the ferroelectric layers 406a, 406b have too low of a remanent polarization to effectively store data.

In some embodiments, the channel layers 408a, 408b may each have a thickness T2 ranging from approximately 1 nanometer to approximately 20 nanometers, from approximately 1 nanometer to approximately 5 nanometers, from approximately 5 nanometers to approximately 20 nanometers, or some other suitable value. In some embodiments, if the thickness T2 is too small (e.g., less than approximately 1 nanometer), the channel layers 408a, 408b may not be able to effectively conduct during operation. In some embodiments, if the thickness T2 is too large (e.g., greater than approximately 20 nanometers), the gate capacitance of the ferroelectric memory elements 102a, 102b may not be large enough, leading to short channel effects and poor channel control.

Figure 5A:
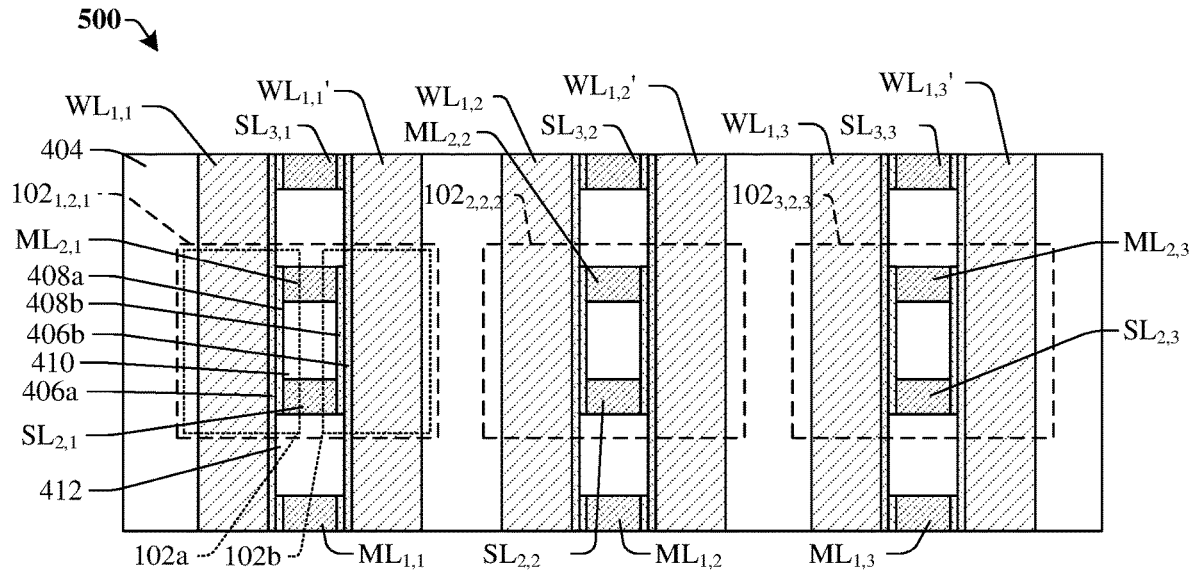
FIG. 5A illustrates a top view of some embodiments of a memory device comprising ferroelectric memory elements.

FIG. 5A illustrates a top view of some embodiments of a memory device 500 comprising ferroelectric memory elements 102a, 102b of FIG. 4. In some embodiments, a first CAM unit $102_{1,2,1}$ is as described with respect to the memory device 400 of FIG. 4. In some embodiments, the first CAM unit $102_{1,2,1}$ is similar in operation to the CAM units 102 of FIG. 1. In some embodiments, the ferroelectric memory elements 102a, 102b are adjacent to one another in a first direction. In some embodiments, the isolation structure 412 laterally separates the first CAM unit $102_{1,2,1}$ from the one or more CAM units in a second direction orthogonal to the first direction, defining a first column of CAM units. In some embodiments, the first word line $WL_{1,1}$ and the second word line $WL_{1,1}'$ may laterally extend in the second direction, such that the gates of the ferroelectric memory elements of the one or more CAM units comprise the first word line $WL_{1,1}$ and the second word line $WL_{1,1}'$. In some embodiments, the memory device 500 further comprises a second column of CAM units structurally similar to the first column of CAM units and separated from the first column of CAM units by the outer insulating structure 404. Gates of the ferroelectric memory elements of the second column of CAM units are coupled together by a third word line $WL_{1,2}$ and a fourth word line $WL_{1,2}'$. In some embodiments, the memory device 500 further comprises a third column of CAM units structurally similar to the first column of CAM units and separated from the second column of CAM units by the outer insulating structure 404. Gates of the ferroelectric memory elements of the third column of CAM units are coupled together by a fifth word line $WL_{1,3}$ and a sixth word line $WL_{1,3}'$. Respective CAM units of the memory device 500 comprise a match line and a source line extending in a third direction orthogonal to the first direction and the second direction, such that the memory device 500 comprises a plurality of match lines $ML_{1,1}$, $ML_{1,2}$, $ML_{1,3}$, $ML_{2,1}$, $ML_{2,2}$, $ML_{2,3}$ and a plurality of source lines $SL_{2,1}$, $SL_{2,2}$, $SL_{2,3}$, $SL_{3,1}$, $SL_{3,2}$, $SL_{3,3}$.

In alternative embodiments, the first CAM unit $102_{1,2,1}$ can instead comprise just the first ferroelectric memory element 102a such that the first word line $WL_{1,1}$ is configured to provide a single-ended signal to the gate of the first ferroelectric memory element 102a. In some of such alternative embodiments, a second CAM unit comprises the second ferroelectric memory element 102b and the second word line $WL_{1,1}'$ is configured to provide a single-ended signal to the gate of the second ferroelectric memory element 102b.

In some embodiments, the isolation structure 412 may be or otherwise comprise, for example, silicon oxycarbide, silicon oxycarbonitride, aluminum oxide, hafnium dioxide, lanthanum oxide, some other suitable oxide-doped or metal oxide material(s), or some other suitable material(s). In some embodiments, the isolation structure 412 comprises a different material than that of the inner insulating layer 410. In some embodiments, the inner insulating layer 410 and the outer insulating structure 404 may be or otherwise comprise, for example, an oxide or some other suitable material(s). In some embodiments, the first channel layer 408a and the second channel layer 408b may be or otherwise comprise, for example, indium gallium zinc oxide, indium zinc oxide, indium tin oxide, indium tungsten oxide, zinc tin oxide, zinc oxide, gallium oxide, tin oxide, or some other suitable oxide semiconductor material(s). In some embodiments, the first ferroelectric layer 406a and the second ferroelectric layer 406b may be or otherwise comprise, for example, a ferroelectric material (hafnium zirconium oxide, hafnium oxide, or some other suitable ferroelectric material(s). In some embodiments, the ferroelectric material may be further doped with lanthanum, cerium, silicon, aluminum, or some other suitable material(s) to improve ferroelectricity. In some embodiments, the first word line $WL_{1,1}$, the second word line $WL_{1,1}'$, the third word line $WL_{1,2}$, the fourth word line $WL_{1,2}'$, the fifth word line $WL_{1,3}$, and the sixth word line $WL_{1,3}'$ are conductive and may be or otherwise comprise, for example, tungsten, titanium nitride, aluminum copper, or some other suitable material(s). In some embodiments, the plurality of match lines $ML_{1,1}$, $ML_{1,2}$, $ML_{1,3}$, $ML_{2,1}$, $ML_{2,2}$, $ML_{2,3}$ and the plurality of source lines $SL_{2,1}$, $SL_{2,2}$, $SL_{2,3}$, $SL_{3,1}$, $SL_{3,2}$, $SL_{3,3}$ are conductive and may be or otherwise comprise, titanium nitride, tungsten, ruthenium, or some other suitable material(s). The cross-sectional view 500A may be taken along line A of FIGS. 5B and 5C.

Figure 5B:
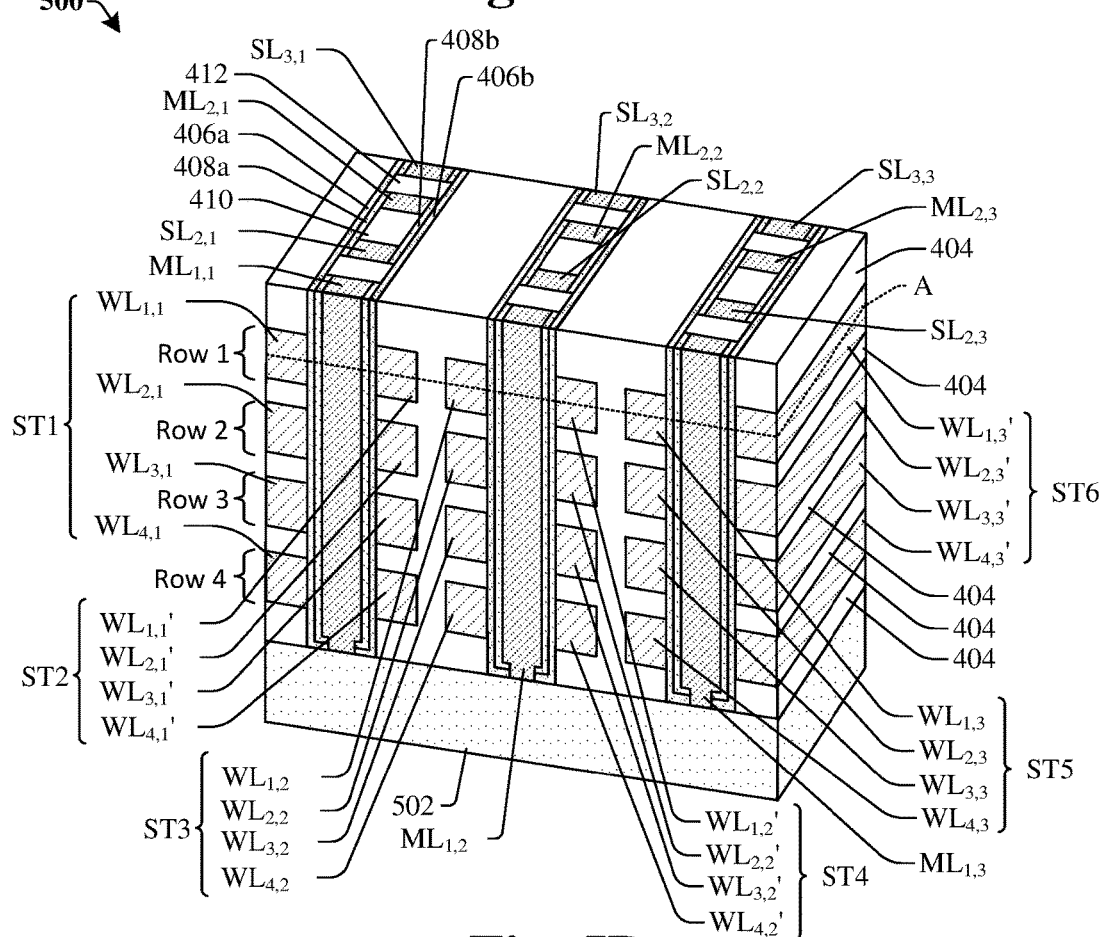
FIGS. 5B-5C illustrate three-dimensional (3D) views of some embodiments of the memory device of FIG. 5A.
Figure 5C:
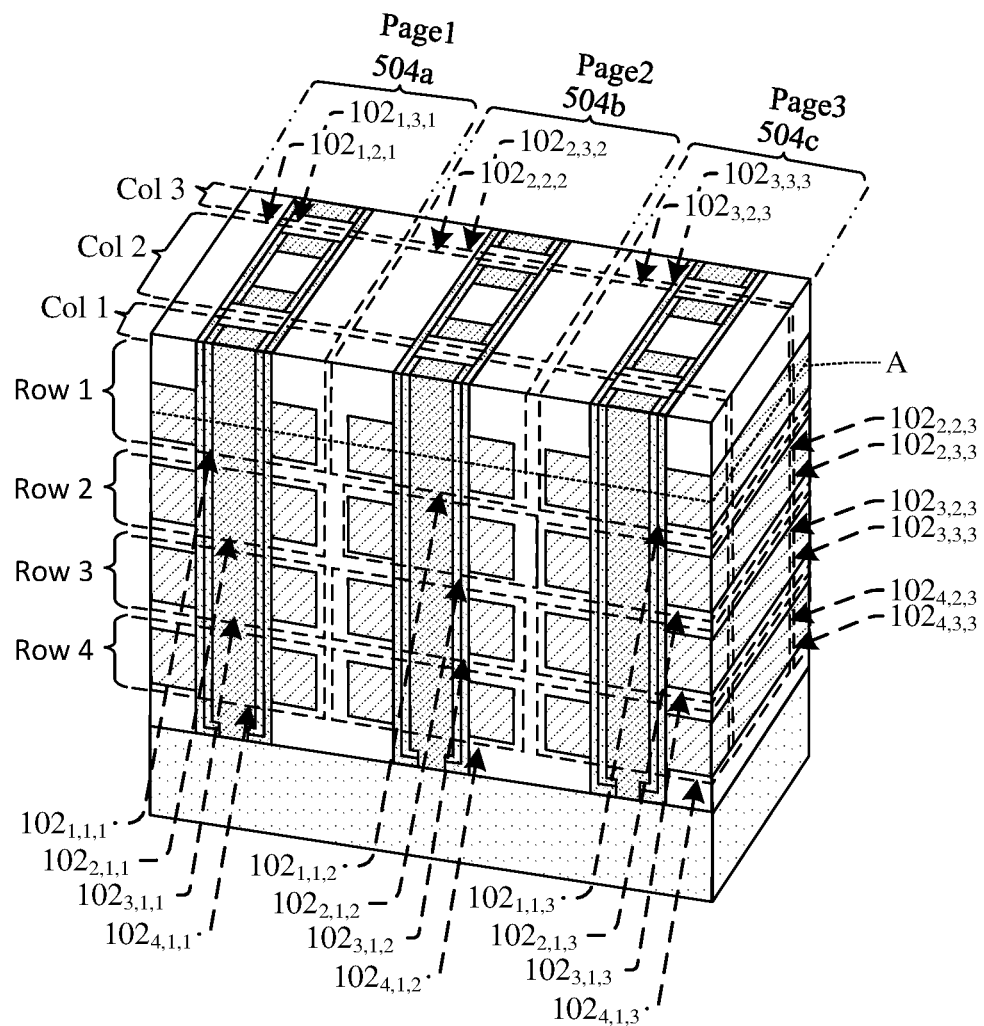

FIGS. 5B-5C illustrate three-dimensional (3D) views of some embodiments of the memory device 500 of FIG. 5A.

As shown by the 3D view of FIG. 5B, in some embodiments, the memory device 500 comprises a plurality of word line stacks ST1, ST2, ST3, ST4, ST5, ST6 overlying a semiconductor substrate 502. The plurality of word line stacks ST1, ST2, ST3, ST4, ST5, ST6 are laterally separated from one another in a first direction. Respective word line stacks ST1, ST2, ST3, ST4, ST5, ST6 comprise a plurality of word lines extending in a second direction orthogonal to the first direction. For example, a first word line stack ST1 comprises a plurality of word lines $WL_{1,1}$, $WL_{2,1}$, $WL_{3,1}$, and $WL_{4,1}$ separated from one another by portions of the outer insulating structure 404. A second word line stack ST2 comprises a plurality of word lines $WL_{1,1}'$, $WL_{2,1}'$, $WL_{3,1}'$, $WL_{4,1}'$ separated from one another by portions of the outer insulating structure 404. A third word line stack ST3 comprises a plurality of word lines $WL_{1,2}$, $WL_{2,2}$, $WL_{3,2}$, $WL_{4,2}$ separated from one another by portions of the outer insulating structure 404. A fourth word line stack ST4 comprises a plurality of word lines $WL_{1,2}'$, $WL_{2,2}'$, $WL_{3,2}'$, $WL_{4,2}'$ separated from one another by portions of the outer insulating structure 404. A fifth word line stack ST5 comprises a plurality of word lines $WL_{1,3}$, $WL_{2,3}$, $WL_{3,3}$, $WL_{4,3}$ separated from one another by portions of the outer insulating structure 404. A sixth word line stack ST6 comprises a plurality of word lines $WL_{1,3}'$, $WL_{2,3}'$, $WL_{3,3}'$, $WL_{4,3}'$ separated from one another by portions of the outer insulating structure 404. In some embodiments, word lines of the plurality of word lines are labeled $WL_{row,page}$ for word lines coupled to first ferroelectric memory elements as described in FIG. 5A or $WLL_{row,page}'$ for word lines coupled to second ferroelectric memory elements as described in FIG. 5A. Word lines having a same row value are disposed at a same row (e.g., Row 1, Row 2, Row 3, Row 4) and word lines having a same page value are disposed in a same page (e.g., pages 504a, 504b, 504c of FIG. 5C). In some embodiments, the semiconductor substrate 502 comprises a complementary metal oxide semiconductor (CMOS) device, such that the memory device 500 comprises a CMOS under array (CuA) to improve density.

Ferroelectric layers 406a, 406b are disposed along opposing sidewalls of the plurality of word line stacks ST1, ST2, ST3, ST4, ST5, ST6. Channel layers 408a, 408b are respectively disposed along opposing sidewalls of the ferroelectric layers 406a, 406b. An inner insulating layer 410 is disposed between respective opposing sidewalls of the channel layers 408a, 408b. A plurality of match lines and a plurality of source lines extend in a third direction orthogonal to the first direction and the second direction and are disposed on opposing sides of the inner insulating layer 410. In some embodiments, match lines of the plurality of match lines and source lines of the plurality of source lines are labeled $ML_{column,page}$ and $SL_{column, page}$, respectively. Match lines and/or source lines having a same column value are disposed at a same column (e.g., Col 1, Col 2, Col 3). Match lines and/or search lines having a same page value are disposed in a same page (e.g., pages 504a, 504b, 504c of FIG. 5C). Respective match lines of the plurality of match lines and corresponding source lines of the plurality of source are laterally separated from one another in the second direction by the inner insulating layer 410. Although some match lines of the plurality of match lines are illustrated as not having a corresponding source line, it will be appreciated that respective match lines of the plurality of match lines will have a corresponding source line. Although some source lines of the plurality of source lines are illustrated as not having a corresponding match line, it will be appreciated that respective source lines of the plurality of source lines will have a corresponding match line. An isolation structure 412 is disposed between the respective opposing sidewalls of the ferroelectric layers 406a, 406b. In some embodiments, inner sidewalls of the plurality of word lines are flat (e.g., not curved due to an etching process) to keep the channel layers 408a, 408b and the ferroelectric layers 406a, 406b flat to improve performance.

In some embodiments, the semiconductor substrate 502 may be or otherwise comprise, for example, a bulk silicon substrate, a bulk germanium substrate, a group III-V substrate, or some other suitable semiconductor substrate. In some embodiments, respective word lines of the plurality of word line stacks ST1, ST2, ST3, ST4, ST5, ST6 are conductive and may be or otherwise comprise, for example, tungsten, titanium nitride, aluminum, copper, or some other suitable material(s). In some embodiments, the word line driver 104 as described in FIG. 1 and the word line driver 204 of FIG. 2 are disposed in the semiconductor substrate 502 and below the plurality of word line stacks ST1, ST2, ST3, ST4, ST5, ST6.

As shown by the 3D view of FIG. 5C, the memory device 500 comprises a plurality of CAM units. In some embodiments, the CAM units may be structurally similar to the CAM unit $102_{1,2,1}$ described in FIG. 5A and operationally similar to the CAM units 102 as described in FIG. 1. The plurality of CAM units is separated into a plurality of rows of CAM units. In some embodiments, two or more CAM units may be vertically stacked over one another. The plurality of memory cells is further separated into a first page of CAM units 504a (e.g., Page 1), a second page of CAM units 504b (e.g., Page 2) and a third page of CAM units 504c (e.g., Page 3) separated from one another in a first direction and laterally extending in a second direction orthogonal to the first direction. The CAM units 102 are arranged in a plurality of rows (e.g., Row 1, Row 2, Row 3, Row 4) and a plurality of columns (e.g., Col 1, Col 2, Col 3) Individual CAM units of the plurality of CAM units 102 are labeled $102_{row,column,page}$. For example, the first page of CAM units 504a corresponds to a page value of 1, the second page of CAM units 504b corresponds to a page value of 2, and the third page of CAM units 504c corresponds to a page value of 3.

Within a first row of the plurality of rows, the first page of CAM units 504a comprises a first plurality of first row CAM units $102_{1,1,1}$, $102_{1,2,1}$, $102_{1,3,1}$, the second page of CAM units 504b comprises a second plurality of first row CAM units $102_{1,1,2}$, $102_{1,2,2}$, $102_{1,3,2}$, and the third page of CAM units 504c comprises a third plurality of first row CAM units $102_{1,1,3}$, $102_{1,2,3}$, $102_{1,3,3}$. In some embodiments, the first row is the topmost row of the plurality of rows. A second row of the plurality of rows underlies and is substantially similar to the first row. In some embodiments, the second row may comprise, for example, a first plurality of second row CAM units $102_{2,1,1}$, a second plurality of second row CAM units $102_{2,1,2}$, and a third plurality of second row CAM units $102_{2,1,3}$, $102_{2,2,3}$, $102_{2,3,3}$. A third row of the plurality of rows underlies the second row and is substantially similar to the first row. In some embodiments, the third row may comprise, for example, a first plurality of third row CAM units $102_{3,1,1}$, a second plurality of third row CAM units $102_{3,1,2}$, and a third plurality of third row CAM units $102_{3,1,3}$, $102_{3,2,3}$, $102_{3,3,3}$. A fourth layer of the plurality of vertically stacked layers underlies the fourth row and is substantially similar to the first row. In some embodiments, the fourth row may comprise, for example, a first plurality of fourth row CAM units $102_{4,1,1}$ a second plurality of fourth row CAM units $102_{4,1,2}$, and a third plurality of fourth layer CAM units $102_{4,1,3}$, $102_{4,2,3}$, $102_{4,3,3}$. Although the plurality of CAM units is illustrated as comprising approximately 24 CAM units, it should be appreciated that other similar CAM units are present that are not visible.

In some alternative embodiments, the plurality of CAM units may be operationally similar to the ferroelectric memory elements 102a, 102b of FIG. 2. In some of such alternative embodiments, respective CAM units of the plurality of CAM units instead comprise a single ferroelectric memory element such that a word line of the plurality of word lines is configured to provide a single-ended signal to the gate of the single ferroelectric memory element. In some of such alternative embodiments, the pages of CAM units 504a, 504b, 504c instead comprise pairs of CAM units adjacent to one another in the first direction.

Accordingly, in some embodiments, the present disclosure relates to a memory device, including a plurality of content addressable memory (CAM) units arranged in rows and columns and configured to store a plurality of data states, respectively. A CAM unit of the plurality of CAM units includes a first ferroelectric memory element, a plurality of word lines extending along the rows and configured to provide a search query to the plurality of CAM units for bitwise comparison between the search query and the data states of the plurality of CAM units, and a plurality of match lines extending along the columns and configured to output a plurality of match signals, respectively from respective columns of CAM units. A match signal of a column is asserted when the data states of the respective CAM units of the column match corresponding bits of the search query and is de-asserted when the data states of the respective CAM units of the column differ from corresponding bits of the search query.

In other embodiments, the present disclosure relates to a memory device, including a semiconductor substrate, a first word line disposed at a first height over the semiconductor substrate, a second word line disposed at the first height over the semiconductor substrate and spaced apart laterally from the first word line in a first direction, the first word line and the second word line extending in a second direction orthogonal to the first direction such that the second word line has a second inner sidewall nearest to a first inner sidewall of the first word line, a match line disposed between the first word line and the second word line and extending in a third direction that is orthogonal to both the first direction and the second direction, a first ferroelectric layer disposed along the first inner sidewall of the first word line, a first channel layer disposed between the first ferroelectric layer and the match line, a second ferroelectric layer disposed along the second inner sidewall of the second word line, and a second channel layer disposed between the first ferroelectric layer and the match line.

In yet other embodiments, the present disclosure relates to a method for searching a memory device, including providing a search query to a word line driver, providing, by the word line driver, the search query to a plurality of content addressable memory (CAM) units for bitwise comparison between the search query and data states of the plurality of CAM units, and outputting, by a decoder, an address of a column of the plurality of columns having data states that respectively match bits of the search query. The plurality of CAM units includes a plurality of columns of CAM units, wherein each column of the plurality of columns includes a first number of the plurality of CAM units coupled together by a match line. A second number of the plurality of CAM units include first ferroelectric memory elements coupled together by a first word line. The second number is equal to a number of columns in the plurality of columns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of content addressable memory (CAM) units arranged in rows, columns, and pages and configured to store a plurality of data states, respectively, a CAM unit of the plurality of CAM units comprising a first ferroelectric memory element, wherein the first ferroelectric memory element corresponds to an intersection of a row, a column, and a page, and wherein each CAM unit of the column and the row lie on a first plane, each CAM unit of the row and the page lie in a second plane orthogonal to the first plane, and each CAM unit of the column and the page lie in a third plane orthogonal to the first plane and orthogonal to the second plane;
a plurality of word lines extending along the rows and extending along or in parallel to the first plane and configured to provide a search query to the plurality of CAM units for bitwise comparison between the search query and the data states of the plurality of CAM units; and
a plurality of match lines extending along the columns and extending along or in parallel with the first plane and configured to output a plurality of match signals, respectively from respective columns of CAM units, wherein a match signal of a column is asserted when the data states of the respective CAM units of the column match corresponding bits of the search query and is de-asserted when the data states of the respective CAM units of the column differ from corresponding bits of the search query.

2. The memory device of claim 1, wherein the first ferroelectric memory element comprises:
a first gate coupled to a first word line of the plurality of word lines;
a first source coupled to a source line; and
a first drain coupled to a match line of the plurality of match lines.

3. The memory device of claim 2, wherein the first word line is configured to provide a single-ended signal to the CAM unit.

4. The memory device of claim 2, wherein the CAM unit further comprises a second ferroelectric memory element comprising:
a second gate coupled to a second word line of the plurality of word lines;
a second source coupled to the source line; and
a second drain coupled to the match line.

5. The memory device of claim 4, wherein the first word line and the second word line are each configured to provide a differential signal to the CAM unit.

6. The memory device of claim 1, further comprising:
a word line driver coupled to the plurality of word lines and configured to provide the search query to the plurality of CAM units via the plurality of word lines.

7. The memory device of claim 1, wherein respective CAM units of the plurality of CAM units comprise no more than two transistors.

8. The memory device of claim 1, further comprising:
a decoder coupled to the plurality of match lines and configured to output an address of a column of CAM units that matches the search query.

9. The memory device of claim 1, wherein when a column of CAM units does not bitwise match the search query, an output signal is provided to a match line corresponding to the column of CAM units from one or more CAM units of the column of CAM units.

10. A method for searching a memory device, comprising:
providing a search query to a word line driver;
providing, by the word line driver, the search query to a plurality of content addressable memory (CAM) units arranged in rows, columns, and pages for bitwise comparison between the search query and data states of the plurality of CAM units, wherein the plurality of CAM units comprise a plurality of columns of CAM units, wherein each column of the plurality of columns comprises a first number of the plurality of CAM units coupled together by a match line; and
outputting, by a decoder, an address of a column of the plurality of columns having data states that respectively match bits of the search query,
wherein a second number of the plurality of CAM units comprise first ferroelectric memory elements coupled together by a first word line, wherein the second number is equal to a number of columns in the plurality of columns, wherein the first ferroelectric memory elements correspond to an intersection of a row, a column, and a page, and wherein each CAM unit of the column and the row lie on a first plane, each CAM unit of the row and the page lie in a second plane orthogonal to the first plane, and each CAM unit of the column and the page lie in a third plane orthogonal to the first plane and orthogonal to the second plane, and wherein the first word line extends along or in parallel to the first plane, and wherein the match line extends along or in parallel with the first plane.

11. The method of claim 10, wherein the second number of the plurality of CAM units further comprise second ferroelectric memory elements coupled together by a second word line, and wherein providing the search query to the plurality of CAM units comprises:
applying a first search voltage to the second word line and a second search voltage to the first word line to search for a first data state of the second number of the plurality of CAM units; or
applying the first search voltage to the first word line and the second search voltage to the second word line to search for a second data state of second number of the plurality of CAM units.

12. The method of claim 11, wherein data states of the CAM units are based on threshold voltages of the first ferroelectric memory elements and the second ferroelectric memory elements, wherein the first ferroelectric memory elements and the second ferroelectric memory elements can have either a first threshold voltage or a second threshold voltage, wherein the first threshold voltage is less than the second threshold voltage, wherein the first search voltage is less than the first threshold voltage, and wherein the second search voltage is between the first threshold voltage and the second threshold voltage.

13. The method of claim 10, wherein the first number is equal to a number of bits in the search query.

14. The method of claim 10, wherein a match signal of a column of the plurality of columns is asserted when the data states of the respective CAM units of the column match corresponding bits of the search query and de-asserted when the data states of the respective CAM units of the column differ from corresponding bits of the search query.

15. A memory device, comprising:
an array of content addressable memory (CAM) units comprising ferroelectric memory elements arranged in a plurality of rows and a plurality of columns, and a plurality of pages, the CAM units configured to store a plurality of data states, respectively, wherein the ferroelectric memory elements corresponds to an intersection of a row, a column, and a page, and wherein each CAM unit of the column and the row lie on a first plane, each CAM unit of the row and the page lie in a second plane orthogonal to the first plane, and each CAM unit of the column and the page lie in a third plane orthogonal to the first plane and orthogonal to the second plane;
a plurality of word lines extending along the plurality of rows, and extending along or in parallel with the first plane, respectively, each wordline coupled to respective gates of respective ferroelectric memory elements along a corresponding row; and
a plurality of match lines extending along the plurality of columns, and extending along or in parallel with the first plane, respectively, each match line coupled to respective source regions of respective ferroelectric memory elements along a corresponding column;
a plurality of search lines extending along the plurality of columns, respectively, each search line coupled to respective drain regions of respective ferroelectric memory elements along a corresponding column; and
a decoder coupled to the plurality of match lines.

16. The memory device of claim 15, wherein a CAM unit corresponds to two ferroelectric memory element along a column, and a first word line is coupled to a gate of a first ferroelectric memory element of the CAM unit and a second word line is coupled to a gate of a second ferroelectric memory element of the CAM unit, and the first word line and the second word line provide complementary voltages to the CAM unit.

17. The memory device of claim 15, wherein the plurality of word lines are configured to provide a search query to the array of CAM units for bitwise comparison between the search query and the data states stored in the plurality of CAM units.

18. The memory device of claim 17, wherein the decoder is configured to output an address of a column of CAM units only when data stored in that column matches the search query.

19. The memory device of claim 17, wherein the plurality of match lines are configured to output a plurality of match signals, respectively from the plurality of columns, respectively, wherein a match signal of a column is asserted when the data states of the respective CAM units of the column match corresponding bits of the search query and is de-asserted when the data states of the respective CAM units of the column differ from corresponding bits of the search query.

20. The memory device of claim 15, wherein respective CAM units of the plurality of CAM units comprise no more than two transistors.

* * * * *